United States Patent
Ang et al.

(10) Patent No.: US 6,664,153 B2
(45) Date of Patent: Dec. 16, 2003

(54) METHOD TO FABRICATE A SINGLE GATE WITH DUAL WORK-FUNCTIONS

(75) Inventors: Chew Hoe Ang, Singapore (SG); Eng Hua Lim, Singapore (SG); Randall Cher Liang Cha, Singapore (SG); Jia Zhen Zheng, Singapore (SG); Elgin Quek, Singapore (SG); Mei Sheng Zhou, Singapore (SG); Daniel Yen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 83 days.

(21) Appl. No.: 10/072,099

(22) Filed: Feb. 8, 2002

(65) Prior Publication Data

US 2003/0153139 A1 Aug. 14, 2003

(51) Int. Cl.[7] .................. H01L 21/336; H01L 21/8234; H01L 21/3205; H01L 31/062; H01L 23/48

(52) U.S. Cl. .................. 438/197; 438/528; 438/585; 438/586; 438/587; 257/288; 257/407; 257/408; 257/763

(58) Field of Search .................. 438/585–596, 438/528, 197; 257/288, 407, 408, 763

(56) References Cited

U.S. PATENT DOCUMENTS

| | | | | |
|---|---|---|---|---|
| 4,714,519 A | * | 12/1987 | Pfiester | 437/81 |
| 4,978,626 A | * | 12/1990 | Poon et al. | 437/44 |
| 5,108,940 A | * | 4/1992 | Williams | 437/44 |
| 5,530,265 A | | 6/1996 | Takemura | 257/66 |
| 5,620,906 A | | 4/1997 | Yamaguchi et al. | 438/162 |
| 5,759,920 A | * | 6/1998 | Burns, Jr. et al. | 438/696 |
| 5,770,490 A | | 6/1998 | Frenette et al. | 438/199 |
| 5,804,496 A | * | 9/1998 | Duane | 438/520 |
| 6,027,961 A | * | 2/2000 | Maiti et al. | 438/199 |
| 6,037,247 A | * | 3/2000 | Anand | 438/618 |
| 6,087,225 A | * | 7/2000 | Bronner et al. | 438/275 |
| 6,187,657 B1 | | 2/2001 | Xiang et al. | 438/596 |
| 6,235,574 B1 | | 5/2001 | Többen et al. | 438/241 |
| 6,300,177 B1 | * | 10/2001 | Sundaresan et al. | 438/197 |
| 6,365,466 B1 | * | 4/2002 | Krivokapic | 438/283 |

* cited by examiner

*Primary Examiner*—Long Pham
*Assistant Examiner*—Shrinivash Rao
(74) *Attorney, Agent, or Firm*—George O. Saile; Rosemary L. S. Pike

(57) ABSTRACT

A method for forming a single gate having a dual work-function is described. A gate electrode is formed overlying a gate dielectric layer on a substrate. Sidewalls of the gate electrode are selectively doped whereby the doped sidewalls have a first work-function and whereby a central portion of the gate electrode not doped has a second work-function to complete formation of a single gate having multiple work-functions in the fabrication of integrated circuits.

22 Claims, 4 Drawing Sheets

METHOD TO FABRICATE A SINGLE GATE WITH DUAL WORK-FUNCTIONS

BACKGROUND OF THE INVENTION (1) Field of the Invention

The present invention relates to the fabrication of integrated circuit devices, and more particularly, to a method of fabricating a single gate having dual work-functions in the fabrication of integrated circuits.

(2) Description of the Prior Art

As technology progresses, enabling higher levels of integration within system integrated circuit chips, it will be essential to be able to fabricate semiconductor device gates that accommodate different work-functions within a single gate across a short device channel. Many mature methods can be used to fabricate such gates, either metal or silicon. However, these processes might be cumbersome or expensive.

U.S. Pat. No. 5,770,490 to Frenette et al discloses a dual work-function device wherein different gates have different work-functions depending on doping. U.S. Pat. No. 6,187,657 to Xiang et al shows a gate composed of dual gate materials. U.S. Pat. No. 5,620,906 to Yamaguchi et al teaches ion doping to form source/drain regions. U.S. Pat. No. 5,530,265 to Takemura and U.S. Pat. No. 6,235,574 to Tobben et al show doping processes.

SUMMARY OF THE INVENTION

Accordingly, a primary object of the invention is to provide a process for forming a single gate having dual work-functions in the fabrication of integrated circuits.

A further object of the invention is to provide a process for forming a single gate having a dual work-function by means of plasma enhanced ion doping in the fabrication of integrated circuits.

Another object of the invention is to provide a process for forming a single gate having a dual work-function by means of selective plasma enhanced ion doping.

In accordance with the objects of the invention, a method for forming a single gate having a dual work-function is achieved. A gate electrode is formed overlying a gate dielectric layer on a substrate. Sidewalls of the gate electrode are selectively doped whereby the doped sidewalls have a first work-function and whereby a central portion of the gate electrode not doped has a second work-function to complete formation of a single gate having multiple work-functions in the fabrication of integrated circuits.

BRIEF DESCRIPTION OF THE DRAWINGS

In the accompanying drawings forming a material part of this description, there is shown:

FIGS. 1 through 4 are cross-sectional representations of a preferred embodiment of the present invention.

DESCRIPTION OF THE PREFERRED EMBODIMENTS

The present invention proposes a simple and relatively inexpensive method to fabricate a single gate having a dual work-function across the device channel. The sidewalls of the gate are selectively doped via plasma doping with appropriate masking. The extent and profile of the doped sidewall is determined by the ion density, pressure, and annealing duration. During doping, the substrate is not biased so as to eradicate plasma induced damage. Because of the selective doping, the gate portion at the sidewalls will possess different properties from the central bulk gate. This will mean that the sidewall portions will have a different work-function across the device channel than will the central bulk gate.

Figure 1:
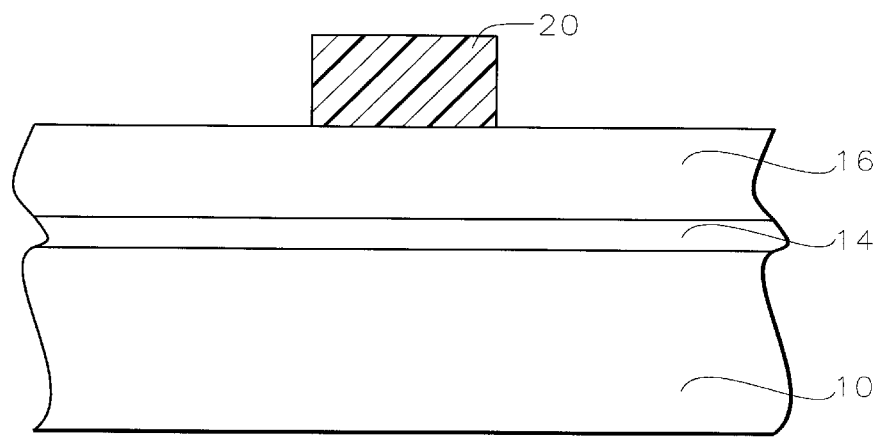

Referring now more particularly to FIG. 1, there is shown a semiconductor substrate 10. This is preferably monocrystalline silicon. A gate dielectric oxide layer 14 is grown or deposited over the substrate to a thickness of between about 10 and 100 Angstroms. The gate dielectric layer may be a high dielectric constant (k) material such as silicon nitride, $HfO_2$, $ZrO_2$, $Ta_2O_5$, and so on, or silicon dioxide or a stack of high-k materials and silicon dioxide, depending on the gate material and other design considerations. Now, a gate material layer 16 is deposited over the gate dielectric layer to a thickness of between about 1000 and 3000 Angstroms. The gate material may comprise polysilicon, amorphous silicon, or metal, for example.

Figure 2:
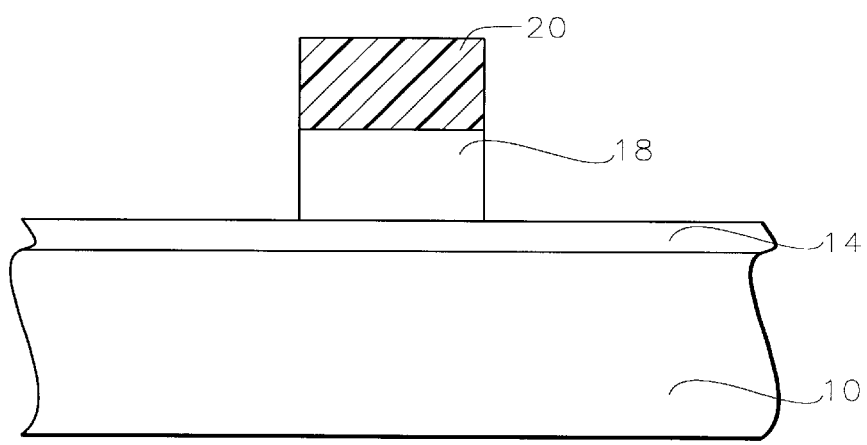

A mask 20 is formed over the gate material layer 16. The gate material layer is patterned to form a gate electrode 18, as shown in FIG. 2, using a dry etch, for example.

Now, the gate is doped by plasma enhanced ion doping (PEID). In one alternative, shown in FIG. 3A, the mask 20 remains on the gate. The mask shields the top portion of the gate 18 from the plasma doping. PEID is an isotropic doping process that will dope the gate without implantation induced damage. The gate dielectric acts as a shield for the substrate during doping. The sidewalls 24 of the gate 18 are doped with dopants in the plasma. The ion density, duration, and pressure of the doping process will determine the extent and the profile of the doped sidewall gate. For example, pressure may be maintained at between about 1 and 740 Torr and the doping duration may be between about 5 and 200 seconds. The doping profile after PEID is uniform.

After doping, an annealing is performed to drive-in the dopants. The duration of the annealing step also plays a part in determining the depth of dopant diffusion into the gate. For example, the annealing preferably is performed under a $N_2$ ambient at between about 800 and 1000° C. for 15 to 30 minutes.

Figure 3A:
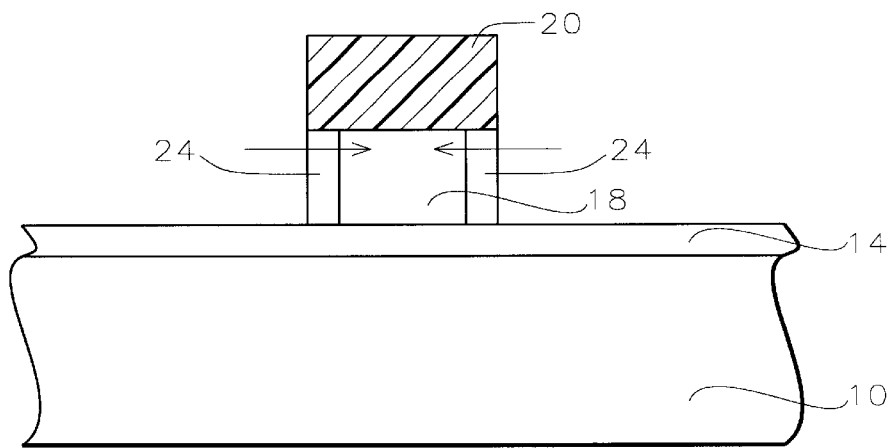
FIGS. 3A through 3C are cross-sectional representations of three alternatives in a preferred embodiment of the present invention.
Figure 3B:
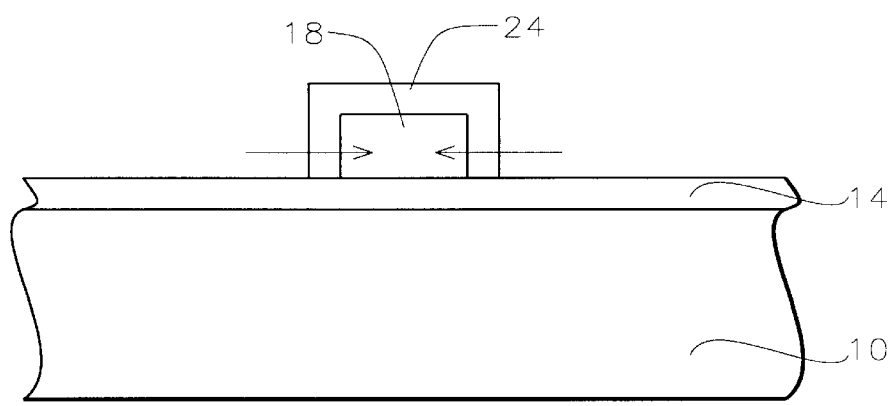

FIG. 3B illustrates the alternative in which the mask 20 is removed before the plasma doping step. In this case, a top portion as well as the sidewall portions of the gate 18 are doped 24.

During the doping step, the substrate is not biased. This will reduce the occurrence of plasma induced damage. If the gate material is polysilicon or amorphous silicon, for example, the dopant ions may be germanium ions, nitrogen ions, oxygen ions, metallic ions, and so on. If the gate material is a metal such as titanium nitride, tungsten, ruthenium and so on, silicon ions or germanium ions may be used as dopants.

The work-function of the central bulk gate 18 and the work-function of the doped gate 24 will be different. The difference in work-function will depend upon the dopant concentration and annealing duration.

It should be noted that if germanium, for example, is doped on the top portion of the gate (as in FIG. 3B), there may be a concern during subsequent silicidation.

Figure 3C:
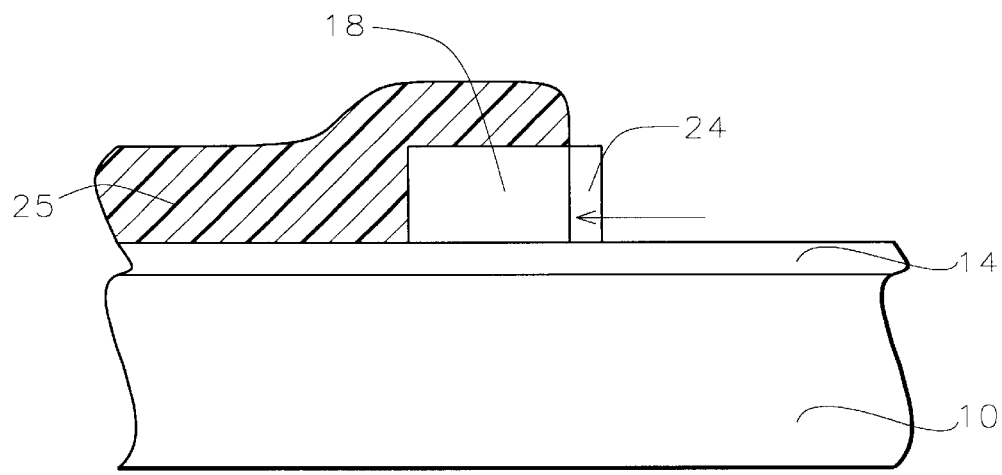

In a further alternative, the mask 20 may be removed before doping and a second mask 25 may be formed over the gate to shield all except one side portion of the gate as shown in FIG. 3C. In this case, the plasma enhanced ion doping is restricted to just one side of the gate. This implies that the channel beneath the doped sidewall gate experiences a different work-function than the other portions of the gate.

Figure 4:
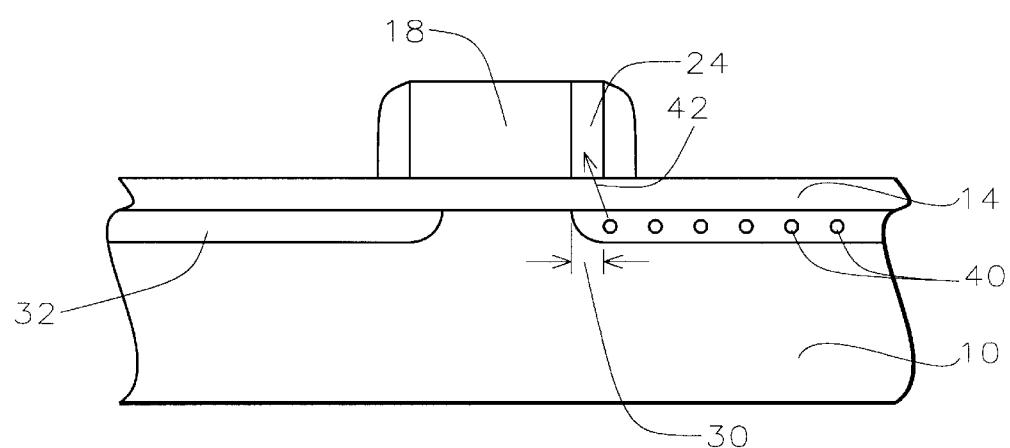

FIG. 4 illustrates the channel portion 30 under the doped sidewall 24 of the gate. This small part of the channel that experiences a different work-function may be used for other specific purposes such as hot carrier injection (HCI), for example. The portion of the channel underlying the doped region can be engineered for HCI to be between about 20 and 100 nm, for example, depending upon the width of the doped portion of the gate 24. Electrons 40 and hot carrier injection 42 are illustrated in FIG. 4, for example.

Figure 5:
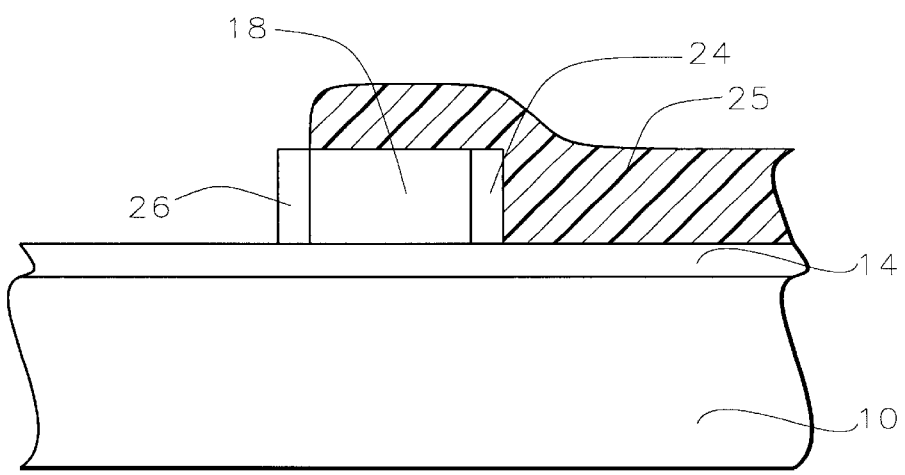
FIG. 5 is a cross-sectional representation of a combination of alternatives in a preferred embodiment of the present invention.

Combinations of the alternatives shown in FIGS. 3A through 3C may be used to achieve multiple work functions in the single gate. For example, alternative A may be used to form doped portion 24 of the gate 18. Then alternative C may be used as shown in FIG. 5 to dope the another portion 25 of the gate. In this example, the gate has three work-functions—one under the undoped gate 18, a second work-function under the doped portion 24, and a third work-function under the doped portion 26.

This completes formation of a single gate having multiple work-functions.

While the invention has been particularly shown and described with reference to the preferred embodiments thereof, it will be understood by those skilled in the art that various changes in form and details may be made without departing from the spirit and scope of the invention.

What is claimed is:

1. A method of forming a single gate having multiple work-functions in the fabrication of integrated circuits comprising:
   depositing a gate material layer overlying a gate dielectric layer on a substrate;
   patterning said gate material layer to form a gate electrode;
   selectively doping sidewall portions of said gate electrode using isotropic plasma enhanced ion doping wherein said substrate is not biased whereby said doped sidewall portions have a first work-function and whereby a central portion of said gate electrode not doped in said selectively doping step has a second work-function; and
   annealing said substrate in a nitrogen ambient after said doping step to drive-in said dopants into said gate electrode to complete formation of a single gate having multiple work-functions in the fabrication of integrated circuits.

2. The method according to claim 1 wherein said gate material layer is selected from the group consisting of: polysilicon, amorphous silicon, and metal.

3. The method according to claim 1 wherein said gate dielectric is selected from the group consisting of: silicon dioxide, high dielectric constant (k) dielectric materials, and a combination of silicon dioxide and high k dielectric materials.

4. The method according to claim 1 wherein said step of selectively doping said sidewall portions comprises masking a top portion of said gate electrode whereby said dopants dope said sidewall portions of said gate electrode and do not dope said top portion and said central portion of said gate electrode.

5. The method according to claim 1 wherein in said step of selectively doping said sidewall portions, said dopants dope said sidewall portions of said gate electrode and a top portion of said gate electrode and do not dope said central portion of said gate electrode.

6. The method according to claim 1 wherein said step of selectively doping said sidewall portions comprises masking a top portion and one sidewall portion of said gate electrode whereby said dopants dope one of said sidewall portions of said gate electrode not masked and do not dope said top portion, said central portion, and said masked sidewall portion of said gate electrode.

7. The method according to claim 1 wherein said gate material comprises silicon and wherein said step of selectively doping said sidewall portions comprises doping with ions chosen from the group consisting of: germanium ions, nitrogen ions, oxygen ions, and metallic ions.

8. The method according to claim 1 wherein said gate material comprises metal and wherein said step of selectively doping said sidewall portions comprises doping with ions chosen from the group consisting of: silicon ions and germanium ions.

9. The method according to claim 1 wherein each of said sidewall portions of said gate is doped differently and wherein one of said sidewall portions has said first work-function and wherein another of said sidewall portions has a third work-function.

10. A method of forming a single gate having multiple work-functions in the fabrication of integrated circuits comprising:
    depositing a gate material layer overlying a gate dielectric layer on a substrate;
    patterning said gate material layer to form a gate electrode;
    selectively doping sidewall portions of said gate electrode using isotropic plasma enhanced ion doping wherein said substrate is not biased wherein each of said sidewall portions of said gate is doped differently whereby one of said sidewall portions has a first work-function and wherein another of said sidewall portions has a third work-function and whereby a central portion of said gate electrode not doped in said selectively doping step has a second work-functions and
    annealing said substrate in a nitrogen ambient after said doping step to drive-in said dopants into said sate electrode to complete formation of a single gate having multiple work-functions in the fabrication of integrated circuits.

11. The method according to claim 10 wherein said gate material layer is selected from the group consisting of: polysilicon, amorphous silicon, and metal.

12. The method according to claim 10 wherein said gate dielectric is selected from the group consisting of: silicon dioxide, high dielectric constant (k) dielectric materials, and a combination of silicon dioxide and high k dielectric materials.

13. The method according to claim 10 wherein said step of selectively doping said sidewall portions comprises masking a top portion of said gate electrode whereby said dopants dope said sidewall portions of said gate electrode and do not dope said top portion and said central portion of said gate electrode.

14. The method according to claim 10 wherein in said step of selectively doping said sidewall portions, said dopants dope said sidewall portions of said gate electrode and a top portion of said gate electrode and do not dope said central portion of said gate electrode.

15. The method according to claim 10 wherein said step of selectively doping said sidewall portions comprises masking a top portion and one sidewall portion of said gate electrode whereby said dopants dope one of said sidewall portions of said gate electrode not masked and do not dope said top portion, said central portion, and said masked sidewall portion of said gate electrode.

16. The method according to claim 10 wherein said gate material comprises silicon and wherein said step of selectively doping said sidewall portions comprises doping with ions chosen from the group consisting of: germanium ions, nitrogen ions, oxygen ions, and metallic ions.

17. The method according to claim 10 wherein said gate material comprises metal and wherein said step of selectively doping said sidewall portions comprises doping with ions chosen from the group consisting of: silicon ions and germanium ions.

18. A method of forming a single gate having multiple work-functions in the fabrication of integrated circuits comprising:

depositing a gate material layer overlying a gate dielectric layer on a substrate;

patterning said gate material layer to form a gate electrode;

masking a top portion of said gate electrode and selectively doping sidewall portions of said gate electrode using isotropic plasma enhanced ion doping wherein said substrate is not biased whereby said dopants dope said sidewall portions of said gate electrode and do not dope a central portion of said gate electrode whereby said doped sidewall portions have a first work-function and whereby said central portion of said gate electrode not doped in said selectively doping step has a second work-function; and annealing said substrate in a nitrogen ambient to drive-in said dopants into said gate electrode to complete formation of a single gate having multiple work-functions in the fabrication of integrated circuits.

19. The method according to claim 18 wherein said gate material layer is selected from the group consisting of: polysilicon, amorphous silicon, and metal.

20. The method according to claim 18 wherein said gate material comprises silicon and wherein said step of selectively doping said sidewall portions comprises doping with ions chosen from the group consisting of: germanium ions, nitrogen ions, oxygen ions, and metallic ions.

21. The method according to claim 18 wherein said gate material comprises metal and wherein said step of selectively doping said sidewall portions comprises doping with ions chosen from the group consisting of: silicon ions and germanium ions.

22. The method according to claim 18 wherein each of said sidewall portions of said gate is doped differently and wherein one of said sidewall portions has said first work-function and wherein another of said sidewall portions has a third work-function.

* * * * *